(12) United States Patent
Kanasugi et al.

(10) Patent No.: US 7,028,062 B2
(45) Date of Patent: Apr. 11, 2006

(54) FIR FILTER, METHOD OF OPERATING THE SAME, SEMICONDUCTOR INTEGRATED CIRCUIT INCLUDING FIR FILTER, AND COMMUNICATION SYSTEM FOR TRANSMITTING DATA FILTERED BY FIR FILTER

(75) Inventors: Masami Kanasugi, Kawasaki (JP); Shoji Taniguchi, Kawasaki (JP); Koichi Kuroiwa, Kawasaki (JP); Mahiro Hikita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 536 days.

(21) Appl. No.: 09/928,803

(22) Filed: Aug. 13, 2001

(65) Prior Publication Data
US 2002/0002572 A1    Jan. 3, 2002

(30) Foreign Application Priority Data
Dec. 6, 2000    (JP)    ............................. 2000-371058

(51) Int. Cl.
*G06F 17/10*    (2006.01)
(52) U.S. Cl. ...................................... 708/319; 708/300
(58) Field of Classification Search ......... 708/300–323
See application file for complete search history.

(56) References Cited

U.S. PATENT DOCUMENTS

| | | | | |
|---|---|---|---|---|
| 6,236,838 B1 * | 5/2001 | Golemon et al. | ........... | 708/312 |
| 6,650,688 B1 * | 11/2003 | Acharya et al. | ............ | 708/322 |
| 6,665,696 B1 * | 12/2003 | Brokish | ....................... | 708/322 |
| 6,889,239 B1 * | 5/2005 | Akahori | ....................... | 708/319 |

FOREIGN PATENT DOCUMENTS

| | | |
|---|---|---|
| EP | 0 088 474 | 9/1983 |
| GB | 2 201 854 | 9/1988 |
| JP | 08-242141 | 9/1996 |

OTHER PUBLICATIONS

Gary et al., Efficient filter design for IS-95 CDMA systems, 1996, IEEE, pp. 1011-1020.*
Brown et al., Fractionally sampled linear detectors for DS-CDMA, 1998, IEEE, pp. 1873-1877.*
European Search Report dated Jun. 23, 2005.

* cited by examiner

*Primary Examiner*—Kakali Chaki
*Assistant Examiner*—Chat C. Do
(74) *Attorney, Agent, or Firm*—Katten Muchin Roseman LLP

(57) ABSTRACT

The FIR filter separately receives input data consisting of transmitting information and composed of bit strings, and additional data which is added in order to transmit the input data. The input data is operated with the additional data. A difference between the additional data corresponding to previous data (for instance, most recent data) among the input data and the additional data corresponding present data is obtained, and the difference and the previous data are operated. Then, the operation results are added and the resultant is outputted as a filter response. The input data and the additional data are separately received to be operated so that the circuit scale of the filter is reduced. Therefore, a chip of the semiconductor integrated circuit can be downsized and thereby cost reduction in the communication system can be realized.

16 Claims, 13 Drawing Sheets

|  | FF1 | FF2 | FF3 | FF4 | SW1 | SW2 | SW3 |
|---|---|---|---|---|---|---|---|
| Dt−1 | D | C | B | A | OFF | OFF | OFF |
| Dt | a | D | C | B | ON | OFF | OFF |
| Dt+1 | b | a | D | C | OFF | ON | ON |
| Dt+2 | c | b | a | D | OFF | ON | ON |
| Dt+3 | d | c | b | a | OFF | OFF | OFF |

Fig. 3

| | FF1 | FF2 | FF3 | FF4 | SW1 | SW2 | SW4 |
|---|---|---|---|---|---|---|---|
| Dt-1 | D | C | B | A | OFF | OFF | L |
| Dt | a | D | C | B | ON | ON | L |
| Dt+1 | b | a | D | C | OFF | ON | L |
| Dt+2 | c | b | a | D | OFF | OFF | R |
| Dt+3 | d | c | b | a | OFF | OFF | L |

Fig. 7

FIR FILTER, METHOD OF OPERATING THE SAME, SEMICONDUCTOR INTEGRATED CIRCUIT INCLUDING FIR FILTER, AND COMMUNICATION SYSTEM FOR TRANSMITTING DATA FILTERED BY FIR FILTER

BACKGROUND OF THE INVENTION

1. Field of the Invention

The present invention relates to an FIR filter to be used in portable terminals or the like in mobile communication systems.

2. Description of the Related Art

Since an FIR (Finete Impulse Response) filter has liner phase characteristics, a transfer function, and stability which cannot be realized by an analog filter, it is utilized for various usages such as communication systems and audio apparatuses. For example, the FIR filter is applied to a filter in a CDMA (Code Division Multiple Access) system and so on, which is one of digital mobile communication systems. In the CDMA system, a transmission rate is variable so an input resolving power enough to express a ratio of change amounts in transmission rate is necessary. Therefore, the resolving power (a bit width) of input data to a filter is required to be increased as a transmission rate increases. A resolving power for obtaining a sufficient distance between signal points is also required for a code-multiplexed transmission of the CDMA system.

Generally, the FIR filter is composed of a shift register, a multiplier, an adder, and so on. These circuits need to be constituted to correspond to the maximum resolving power of input data. As a result, the circuit scale of the filter is enlarged according to a bit width of the input data. The circuit scale of the multiplier is in particular enlarged to a large extent according to an increase in bit width of the input data. However, the above-mentioned input resolving power does not vary all the time. In general, an interval at which the transmission rate changes is sufficiently longer than a time needed for the input data to pass through the shift register.

SUMMARY OF THE INVENTION

It is an object of the present invention to shorten a bit width of input data to an FIR filter and to reduce a hardware scale.

According to one of the aspects of an FIR filter, a method of operating the FIR filter, a semiconductor integrated circuit including the FIR filter, and a communication system for transmitting data filtered by the FIR filter of the present invention, the FIR filter separately receives input data consisting of transmitting information and composed of bit strings, and additional data which is added in order to transmit the input data. The input data is operated with the additional data. The operation is performed, for example, in a first operational unit. A difference between the additional data corresponding to previous data (for instance, most recent data) among the input data and the additional data corresponding present data is obtained, and the difference and the previous data are operated. The operation is performed, for instance, in a second operational unit. Then, the operation results are added, for example, in an adding unit and the resultant is outputted as a filter response.

The input data and the additional data are separately received to be operated so that the circuit scale of the filter is reduced compared with a case where data which is input data and additional data combined and has a large bit width, is received. Therefore, a chip of the semiconductor integrated circuit can be downsized and thereby cost reduction in the communication system can be realized.

According to another aspect of the FIR filter of the present invention, the FIR filter includes a shift register and factor multipliers. The shift register receives input data in sequence and transmits the received input data to respective delay elements. Each of the factor multipliers multiplies an output from each of the delay elements of the shift register by tap factors. The first operational unit includes a first adder tree and a first multiplier. The first adder tree adds outputs from the factor multipliers. The first multiplier multiplies an output from the first adder tree by the additional data. The second operational unit includes a second adder tree and a second multiplier. The second adder tree adds an output corresponding to the previous data from the factor multipliers. The second multiplier multiplies an output from the second adder tree by a difference in the additional data. The adding unit adds an output from the first multiplier and an output from the second multiplier to output the addition result as a filter response.

A reduction in bit width of input data realizes a decrease in the number of the factor multipliers and further realizes a reduction in the circuit scales of the first and second adder trees and the first and second multipliers.

According to another aspect of the FIR filter of the present invention, the FIR filter includes switches for respectively connecting outputs of the factor multipliers to the second adder tree. The switches are switched on and off in response to a shift operation performed on the input data in the shift register. Then, the previous data among data sequentially held in the delay elements is transmitted to the second adder tree.

According to another aspect of the FIR filter and the method of operating the FIR filter of the present invention, the FIR filter sequentially receives input data consisting of transmitting information and composed of bit strings. Present data among the input data is operated with additional data which is added in order to transmit the present data. The operation is performed, for example, in the first operational unit. Previous data among the input data is operated with the additional data corresponding to the previous data. The operation is performed, for example, in the second operational unit. Then, the operation results are added, for instance, in the adding unit and the resultant is outputted as a filter response. The input data and the additional data are separately received to be operated so that the circuit scale of the filter is reduced.

According to another aspect of the FIR filter and the method of operating the FIR filter of the present invention, the filter sequentially receives input data consisting of transmitting information and composed of bit strings. Present data among the input data is added. The operation is performed, for example, in the first operational unit. A ratio of the additional data corresponding to previous data among the input data to the additional data corresponding to the present data is obtained, and the ratio and the previous data are operated. The operation is performed, for instance, in the second operational unit. The operation results are added, for example, in the adding unit. The addition result is multiplied by the additional data corresponding to the present data. The multiplication is performed, for example, in a multiplying unit. The multiplication result is outputted as a filter response. The input data and the additional data are separately received to be operated so that the circuit scale of the filter is reduced.

According to another aspect of the FIR filter of the present invention, the FIR filter includes a data separation unit for separating data which is inputted to the filter and composed of bit strings, into the input data and the additional data. Thereby, the data which is the input data and the additional data combined can be easily separated.

According to another aspect of the FIR filter of the present invention, the switches are switched off in response to every shift operation of the shift register. The switching-off is sequentially performed, starting from a switch corresponding to one of the factor multipliers at an input side. Therefore, only previous transmitted data, among data transmitted in sequence to each of the delay elements on a subsequent stage in response to the shift operation, is reliably transmitted to the second adder tree.

According to another aspect of the FIR filter of the present invention, the FIR filter includes a switch for connecting an output of a predetermined factor multiplier to the second adder tree and a switch for connecting an output of a predetermined adder which is included in adders composing the first adder tree, to the second adder tree. Each of the switches is switched on and off in response to a shift operation of the input data in the shift register and transmits previous data to the second adder tree. The addition result from the adders in the first adder tree can be utilized so that the circuit scale of the second adder tree is reduced.

According to another aspect of the FIR filter of the present invention, the FIR filter includes a holding circuit and an operational circuit. The holding circuit accepts the additional data in response to a change in input data and holds the accepted data as the additional data corresponding to previous data. The operational circuit obtains a difference between the additional data outputted from the holding circuit and new additional data. Thereby, the difference between both of the additional data can be obtained by a simple logic circuit.

According to another aspect of the FIR filter of the present invention, the FIR filter includes the shift register, the factor multipliers, and switches. The shift register receives input data in sequence and transmits the received input data to the delay elements. Each of the factor multipliers multiplies an output from each of the delay elements of the shift register by tap factors. The switches are switched on and off in response to a shift operation of the input data in the shift register and transmit outputs from the factor multipliers to the first operational unit or the second operational unit.

A bit width of the input data can be shortened, thereby reducing the number of the factor multipliers and the circuit scale of the first operational unit or the second operational unit.

According to another aspect of the FIR filter of the present invention, the FIR filter includes the holding circuit and an operational circuit. The holding circuit accepts the additional data in response to a change in input data and holds the accepted data as the additional data corresponding to previous data. The operational circuit obtains a ratio of the additional data outputted from the holding data to new additional data. Thereby, the ratio of both of the additional data can be obtained by a simple logic circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3 is an explanatory chart showing data inputted to an adder tree ADT2;

FIG. 7 is an explanatory chart showing data inputted to an adder ADD4;

DESCRIPTION OF THE PREFERRED EMBODIMENTS

Hereinafter, embodiments of the present invention is described with reference to the drawings.

Figure 1:
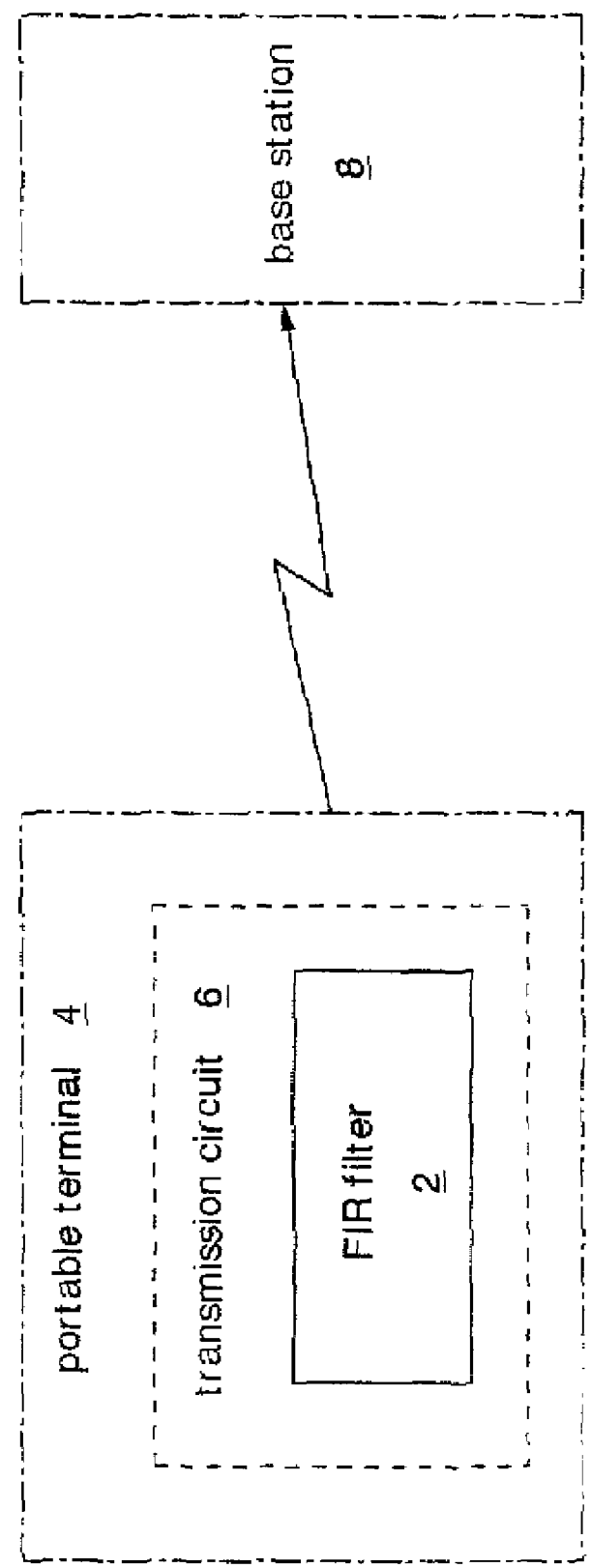
FIG. 1 is a block diagram showing a first embodiment of the present invention.

FIG. 1 shows a first embodiment of an FIR filter, a method of operating the FIR filter, a semiconductor integrated circuit including the FIR filter, and a communication system for transmitting data filtered by the FIR filter of the present invention.

The FIR filter 2 is used in a transmission circuit 6 of a portable terminal 4 in a communication system of, for example, a CDMA system or a W-CDMA (Wideband-CDMA) system. The transmission circuit 6 with CMOS transistors and so on integrated is formed as a single chip on a Si substrate by utilizing semiconductor manufacturing technology. A signal transmitted from the portable terminal 4 is received in a base station 8.

Figure 2:
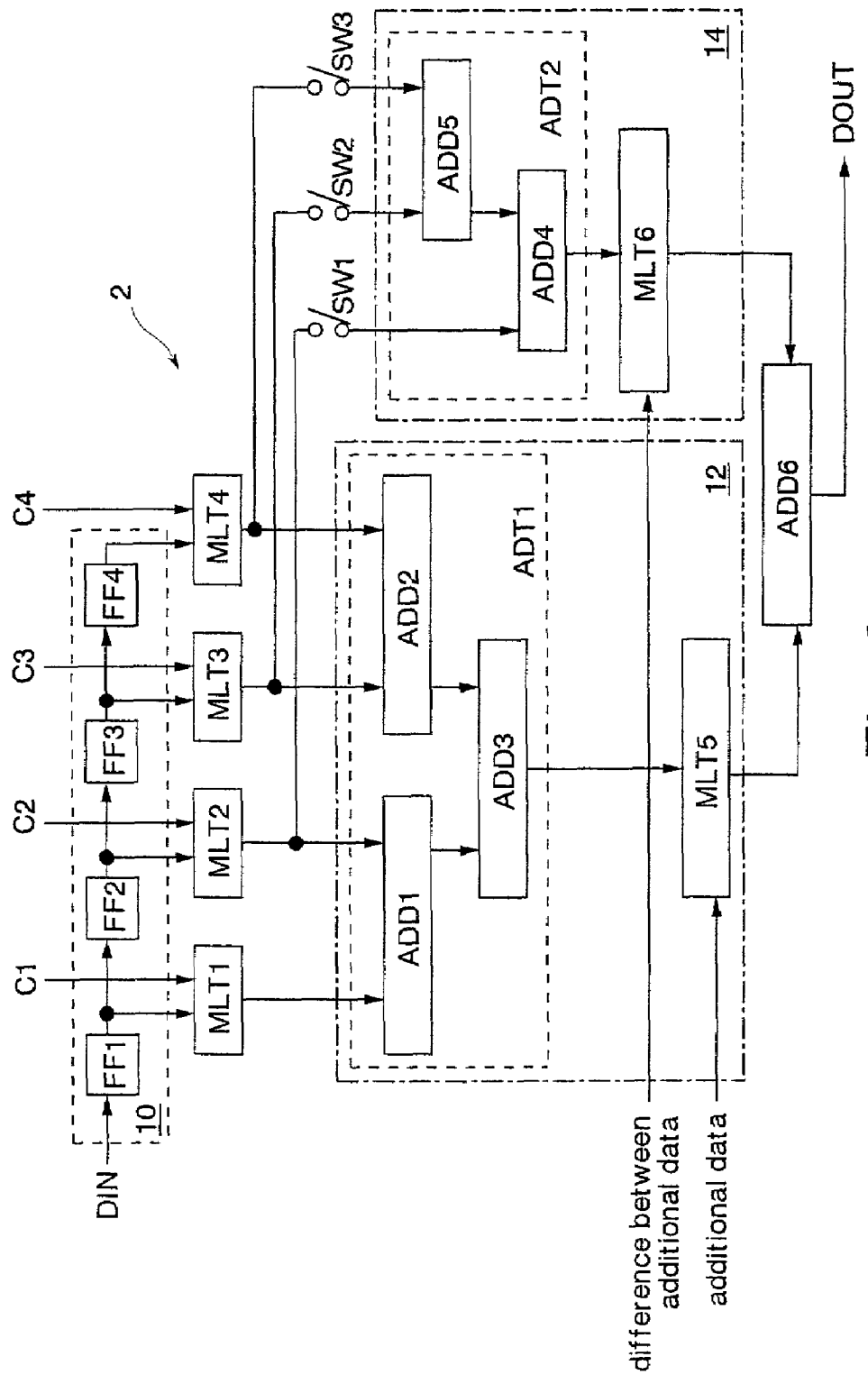
FIG. 2 is a block diagram showing an FIR filter in FIG. 1 in detail.

FIG. 2 shows the FIR filter 2 in detail.

The FIR filter 2 has a shift register 10, factor multipliers MLT1, MLT2, MLT3, MLT4, a first operational unit 12, a second operational unit 14, an adder ADD6, and switches SW1, SW2, SW3.

The shift register 10 is composed of flip-flops FF1, FF2, FF3, FF4 (delay elements) connected in series for holding input data DIN. In this embodiment, a bit width of the input data DIN is set at, for example, 5 bits. Therefore, the shift register 10 receives the input data DIN of 5 bits on the initial flip-flop FF1 and then sequentially shifts the received data to the subsequent flip-flops FF2 to FF4 in synchronization with a sampling trigger signal (not shown). The factor multipliers MLT1 to MLT4 respectively multiply output data from the flip-flops FF1 to FF4 by tap factors C1 to C4.

The first operational unit 12 includes an adder tree ADT1 composed of adders ADD1, ADD2, ADD3, and a multiplier MLT4. The adder tree ADT1 adds data outputted from the factor multipliers MLT1 to MLT4 to output the addition result to the multiplier MLT5. The multiplier MLT5 multiplies the addition result by additional data. Here, the additional data is information which is added in order to transmit the input data DIN to a receiving side (the base station 8 in this case) without fail. In this embodiment, the additional data varies, for example, according to a change in a transmission rate of the data. The maximum bit width (a resolving power) of the additional data is set at 7 bits.

The second operational unit 14 includes an adder tree ADT2 composed of adders ADD4, ADD5, and a factor multiplier MLT6. The adder tree ADT2 receives data outputted from the factor multipliers MLT2 to MLT4 via the switches SW1 to SW3 to output the addition result to a multiplier 6. The switches SW1 to SW3 are composed, for example, of CMOS transmission gates. The multiplier MLT6 multiplies the addition result by a difference in additional data. Here, the difference in additional data means a difference between additional data corresponding to previous data and additional data corresponding to present input data.

The adder ADD6 adds data outputted from the multipliers MLT5, MLT6 to output the addition result as output data DOUT (a filter response).

In this embodiment, as a way of example and for simple explanation, the filter is composed of four flip-flops FF1 to FF4, multipliers corresponding to the flip-flops FF1 to FF4, and adders. In an actual FIR filter, the number of flip-flops (a bit length of input data) and circuit scales of adder trees and so on are larger than those of the flip-flops in FIG. 2.

FIG. 3 shows data inputted to the adder tree ADT2 in FIG. 2.

In the drawing, data A, B, C, and D are previous data held in the flip-flops FF1 to FF4 of the shift register 10, and data a, b, c, and d are newly inputted to the shift register 10 (present data). The arrow indicates a shift direction of the data.

At a time Dt−1, the flip-flops FF1 to FF4 hold the previous data D, C, B, and A respectively. At this time, the switches SW1 to SW3 are off.

At a time Dt, the shift register 10 performs a shift operation and the flip-flops FF2 to FF4 hold the data D, C, and B, respectively. The initial flip-flop FF1 holds data (present data) newly inputted to the filter. At this time, the switches SW1 to SW3 are on. Therefore, the adder tree ADT2 receives the previous data B, C, and D, and then adds the received data.

At a time Dt+1, the shift register 10 performs a shift operation and the flip-flops FF1 to FF4 hold the present data b, a and the previous data D, C, respectively. At this time, the switch SW1 is off. Zero is supplied to a terminal of the adder tree ADT2 corresponding to the switch in an off-state. Therefore, the adder tree ADT2 receives the previous data C, D and adds the received data.

At a time Dt+2, the shift register 10 performs a shift operation and the flip-flops FF1 to FF4 hold the present data c, b, a, and the previous data D, respectively. At this time, the switch SW2 is off. Therefore, the adder tree ADT2 receives only the previous data D to be output to the multiplier MLT6.

At a time Dt+3, the shift register 10 performs a shift operation and the flip-flops FF1 to FF4 hold the present data d, c, b, and a, respectively. At this time, the switch SW 3 is off. Therefore, the new data d, c, b, and a are not transmitted to the adder tree ADT2.

In this way, the adder tree ADT2 operates as an operational circuit for constantly adding previous data.

Figure 4:
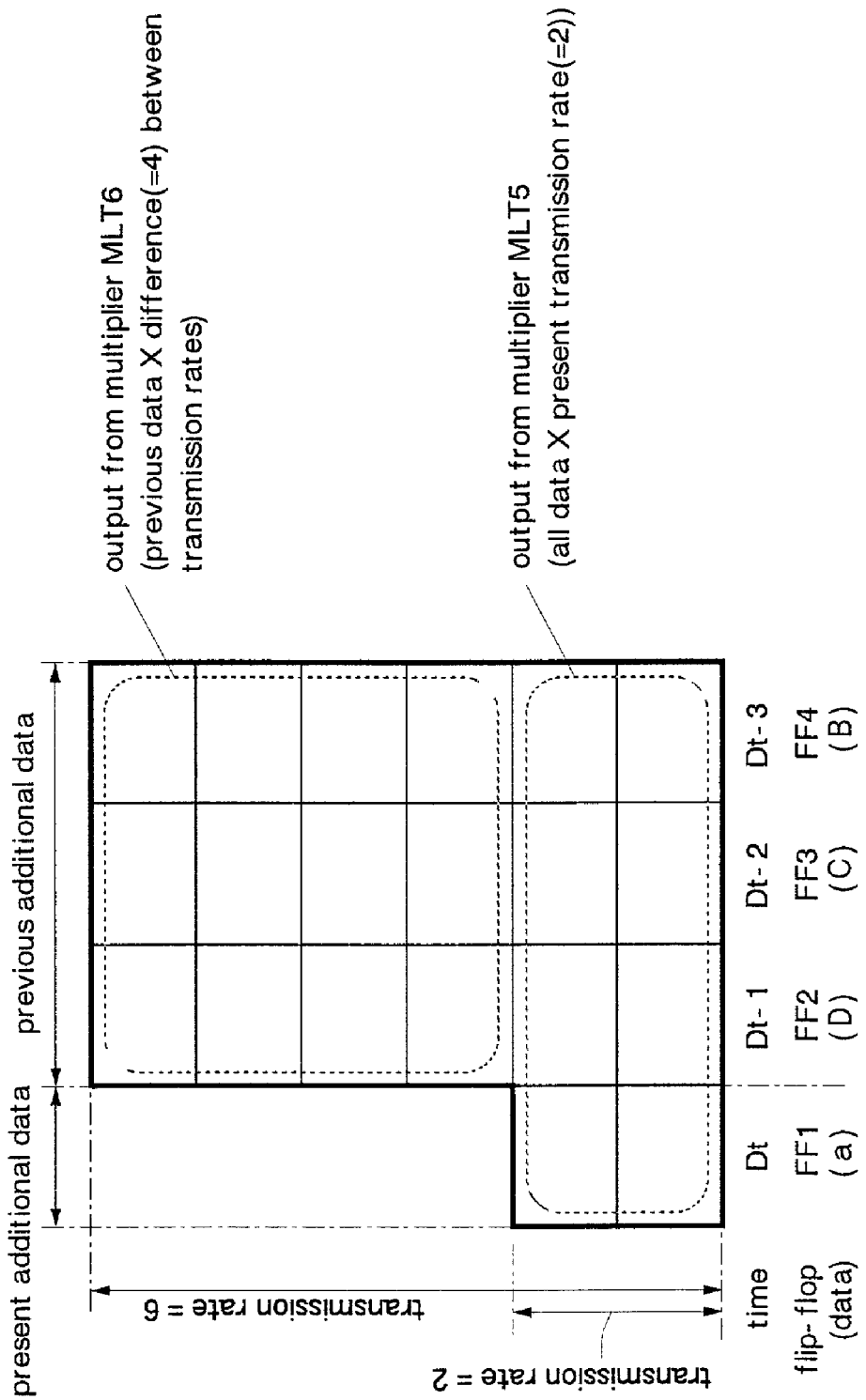
FIG. 4 is an explanatory chart showing an operation of the FIR filter in FIG. 1.

FIG. 4 shows an operation of the FIR filter when the additional data (transmission rate) changes (at the time Dt in FIG. 3).

The time when the data is supplied to the filter is shown in the horizontal direction of the drawing. In other words, the flip-flops FF1 to FF4 holding the data are shown. In the vertical direction of the drawing shown is the transmission rate (resolving power). In this example, a case where the transmission rate is altered from "6" ("000 0110" in binary number) to "2" ("000 0010" in binary number). This means that the previous data (D, C, B, and so on) are transmitted at the transmission rate "6" and the present data (a and so on) are transmitted at the transmission rate "2". In the FIR filter 2, a region surrounded by the bold line is required to be an output response.

The second operational unit 14 in FIG. 2 multiplies the previous data D, C, and B by a difference in the transmission rate (in this case, "4", which is a difference between the transmission rate "6" and the transmission rate "2") in the multiplier MLT6. The multiplication result corresponds to the upper frame depicted with a broken line in FIG. 4. The first operational unit 12 in FIG. 2 multiplies the present data "a" and the previous data D, C, and B by the present transmission rate "2" in the multiplier MLT5. The multiplication result corresponds to the lower frame depicted with a broken line in FIG. 4. Then, the multiplication results are added in the adder ADD6 in FIG. 2 to generate output data DOUT (an output response) corresponding to a region surrounded by the frame depicted with a bold line in the drawing.

In this embodiment described above, the input data and the additional data are separately received to be operated and then the output data DOUT is generated. Therefore, the circuit scale of the filter can be reduced compared with a case where data which is input data and additional data combined and has a large bit width, is received. In other words, the bit width of the input data DIN inputted to the shift register 10 can be decreased so that the number of the factor multipliers can be decreased, and thereby circuit scales of the adder trees 12, 14 and the multipliers MLT5, MLT 6 can be reduced. Therefore, a chip of the semiconductor integrated circuit can be downsized to realize cost reduction of the communication system.

Particularly, a remarkable effect can be obtained by separately receiving the input data DIN and the additional data such as the transmission rate which changes only in a long cycle.

The switches SW1 to SW3 are formed and switched off in response to every shift operation of the shift register 10. The switching-off is performed in sequence starting from the switch corresponding to the factor multiplier on an input side. Consequently, only the previous data among the data supplied to the shift register 10 can be transmitted to the adder tree 14 without fail.

Figure 5:
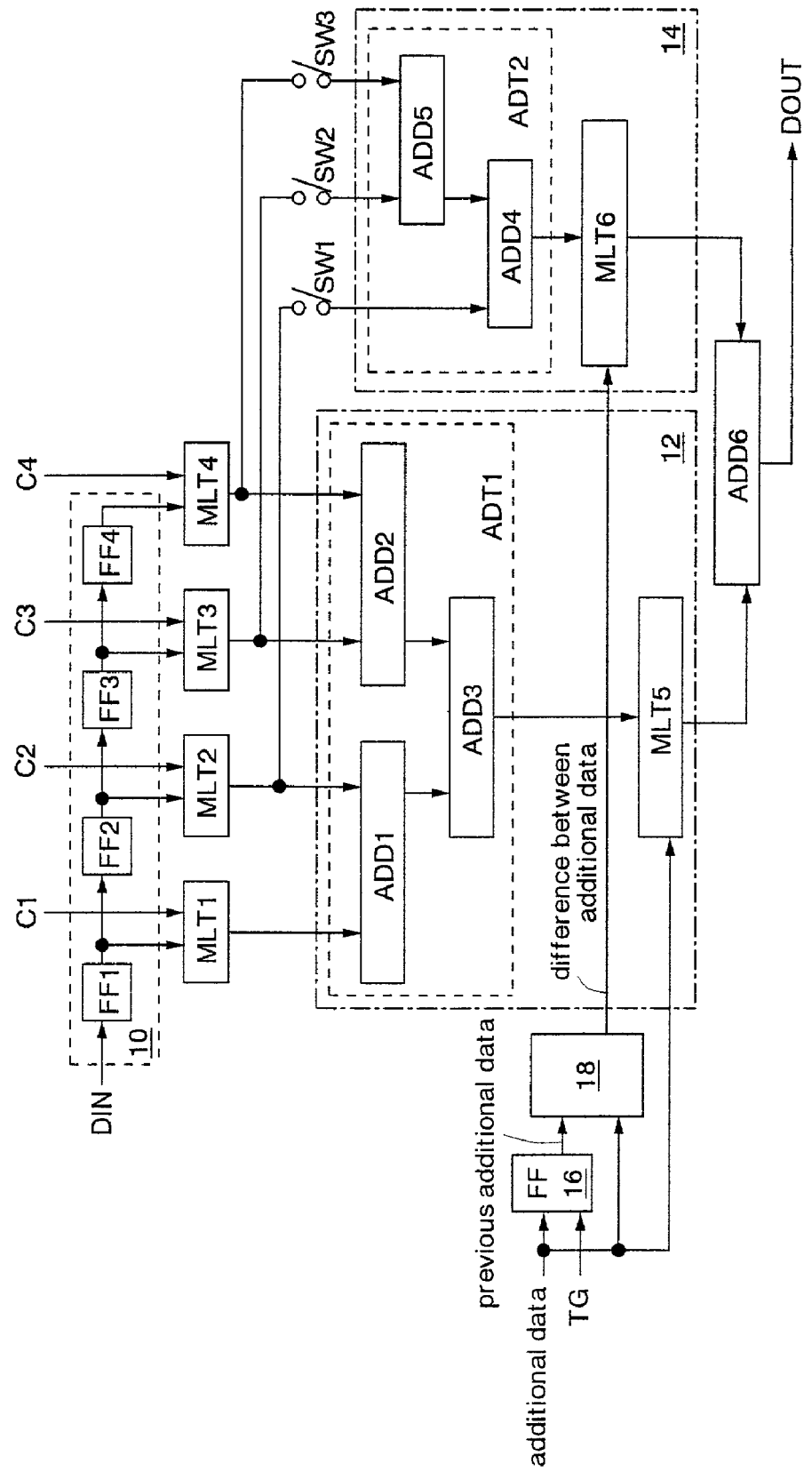
FIG. 5 is a block diagram showing an FIR filter according to a second embodiment of the present invention.

FIG. 5 shows an FIR filter according to a second embodiment of the present invention. The same symbols and numerals are added to the same circuits and signals as those described in the first embodiment and the detailed explanation thereof is omitted.

As in the first embodiment, the FIR filter is used in a transmission circuit (a semiconductor integrated circuit) of a portable terminal in a communication system of, for example, a CDMA system or a W-CDMA (a Wideband-CDMA) system. The FIR filter according to this embodiment is constituted with a holding circuit 16 and an operational circuit 18 additionally provided in the FIR filter 2 in FIG. 2. Other structures are the same as those in the first embodiment (FIG. 2).

The holding circuit 16, which is composed of a flip-flop, accepts additional data (a transmission rate) in synchronization with a trigger signal TG which is generated every time input data DIN is supplied. As a result, previous additional data is outputted from the holding circuit 16. The operational circuit 18 obtains a difference between present additional data and the previous additional data held in the holding circuit 16 and outputs the obtained difference to the multiplier MLT6.

An operation of the FIR filter according to this embodiment is the same as that in the first embodiment described above and therefore, the explanation thereof is omitted.

In this embodiment, the same effect is also obtained as in the first embodiment described above. In this embodiment, the difference in additional data can be further obtained by simple logic circuits (the holding circuit 16 and the operational circuit 18). In other words, the operation for obtaining the difference in additional data can be easily controlled.

Figure 6:
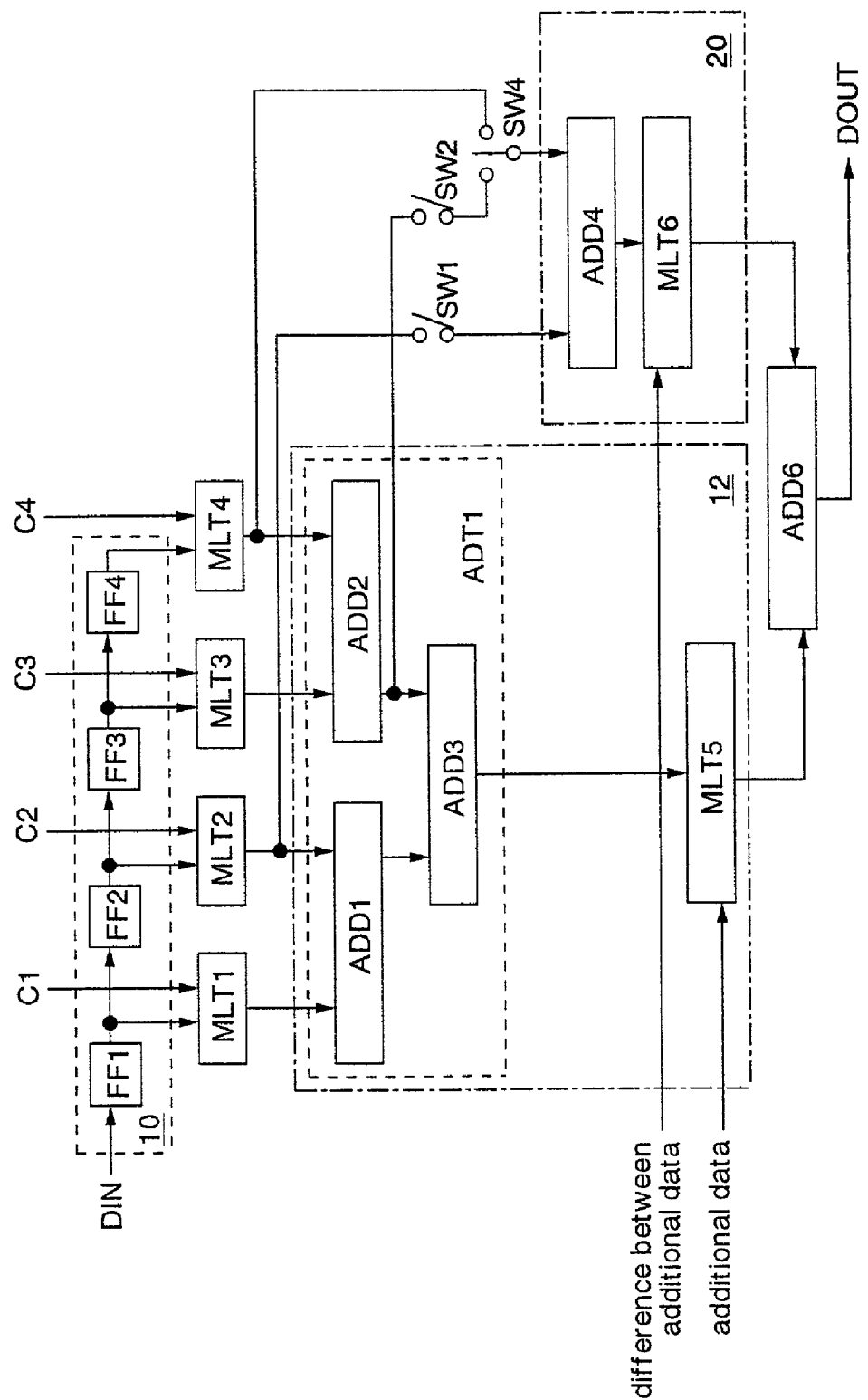
FIG. 6 is a block diagram showing an FIR filter according to a third embodiment of the present invention.

FIG. 6 shows an FIR filter according to a third embodiment. The same symbols and numerals are added to the same circuits and signals as those described in the first embodiment and the detailed explanation thereof is omitted.

As in the first embodiment, the FIR filter is used in a transmission circuit (a semiconductor integrated circuit) of a portable terminal in a communication system of, for example, a CDMA system or a W-CDMA (a Wideband-CDMA) system.

In this embodiment, a second operational unit 20 is formed instead of the second operational unit 14 of the FIR filter 2 in FIG. 2 and a shift switch SW4 is formed instead of the switch SW3. Other structures are the same as those in the first embodiment (FIG. 2).

The second operational unit 20 includes an adder ADD4 and a multiplier MLT6. The switch SW1 transmits data outputted from the factor multiplier MLT2 to the adder ADD4. The switch SW2 transmits data outputted from the adder ADD2 of the adder tree ADT1 to the adder ADD4 via the shift switch SW4. The shift switch SW4 transmits either the output data from the adder ADD2 or output data from the factor multiplier MLT4 to the adder ADD4.

FIG. 7 shows data inputted to the second operational unit 20 in FIG. 6. The explanation on the same operations as those in FIG. 3 described above is omitted. "L" in the drawing indicates that the shift switch SW4 is connected to the switch SW2 and "R" indicates that the shift switch SW4 is connected to the factor multiplier MLT4.

At a time Dt−1, the switches SW1, SW2 are off and the shift switch SW4 is connected to the switch SW2. At a time Dt, the switches SW1, SW2 are on and the adder ADD4 receives previous data B, C, and D. At a time Dt+1, the switch SW1 is off and the adder ADD4 receives the previous data C and D. At a time Dt+2, the switch SW2 is off and the shift switch SW4 is connected to the factor multiplier MLT4. As a result, the adder ADD4 receives only the previous data D and outputs it to the multiplier MLT6. At a time Dt+3, the switches SW1, SW2 are off and the shift switch SW4 is connected to the switch SW2. As a result, new data d, c, b, and a are not transmitted to the adder ADD4. In this way, the adder ADD4 operates as an operational circuit for constantly adding previous data.

An operation of the FIR filter according to this embodiment is the same as that in the first embodiment described above and therefore, the explanation thereof is omitted. In this embodiment, the same effect is also obtained as in the first embodiment described above. Furthermore, the addition result from the adder ADD2 in the adder tree ADT1 is utilized as data for the addition in the second operational unit 20 in this embodiment. Consequently, a circuit scale of the second operational unit 20 can be reduced.

Figure 8:
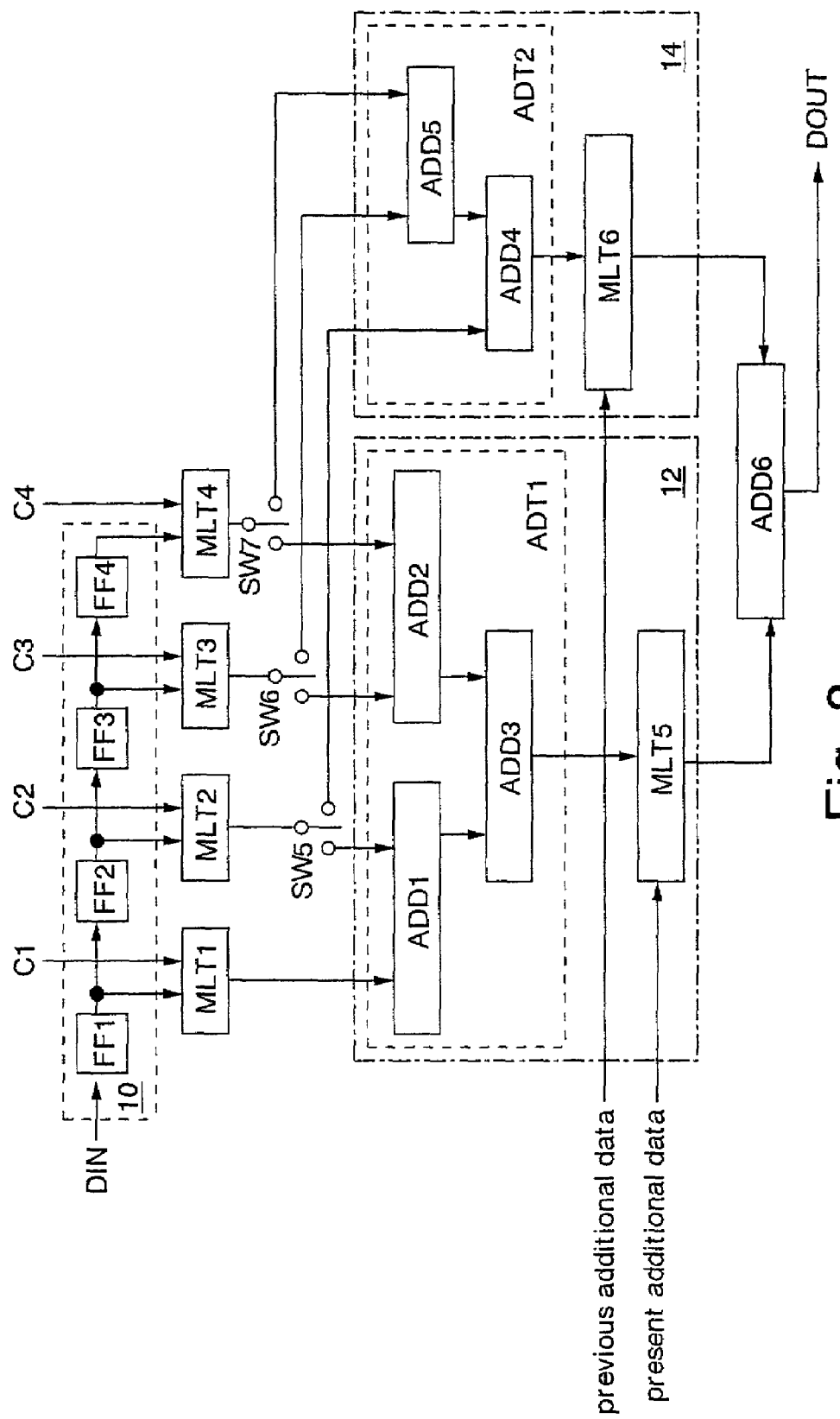
FIG. 8 is a block diagram showing an FIR filter according to a fourth embodiment of the present invention.

FIG. 8 shows an FIR filter according to a fourth embodiment of the present invention. The same symbols and numerals are added to the same circuits and signals as those described in the first embodiment and the detailed explanation thereof is omitted.

As in the first embodiment, the FIR filter is used in a transmission circuit (a semiconductor integrated circuit) of a portable terminal in a communication system of, for example, a CDMA system or a W-CDMA (Wideband-CDMA) system.

In this embodiment, shift switches SW5, SW6, and SW7 are formed instead of the switches SW1 to SW3 in the first embodiment. The switches SW5 to SW7 transmit the data outputted from the respective factor multipliers MLT2 to MLT4 to either the adder tree ADT1 or the adder tree ADT2. The multiplier MLT5 of the first operational unit 12 receives present additional data (a transmission rate) and the multiplier MLT6 of the second operational unit 14 receives previous additional data (a transmission rate). Other structures are the same as in the first embodiment (FIG. 2).

Figure 9:
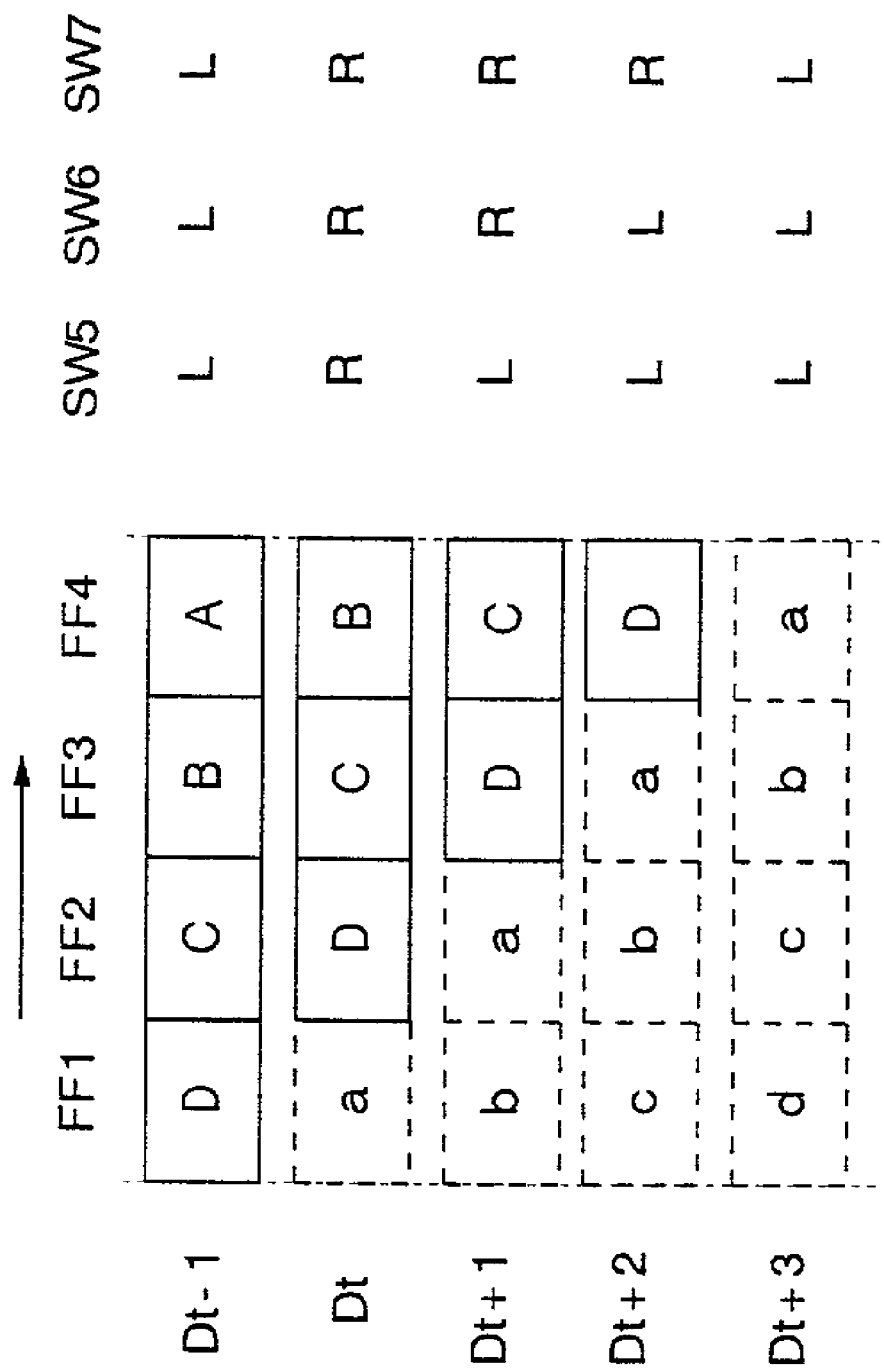
FIG. 9 is an explanatory chart showing data inputted to an adder tree ADT2.

FIG. 9 shows data inputted to the first operational unit 12 and the second operational unit 14 in FIG. 8. The explanation on the same operations as in FIG. 3 described above is omitted. "L" in the drawing indicates that the switches SW5 to SW7 are connected to the first operational unit 12 and "R" indicates that the shift switches SW5 to SW7 are connected to the second operational unit 14.

At a time Dt−1, the shift switches SW5 to SW7 are connected to the first operational unit 12. At this time, the output data from the factor multipliers MLT2 to MLT4 are transmitted to the first operational unit 12. At a time Dt, the shift switches SW5 to SW7 are connected to the first operational unit 14. The first operational unit 12 receives present data "a" and the second operational unit 14 receives previous data B, C, and D.

At a time Dt+1, the shift switch SW5 is connected to the first operational unit 12. The first operational unit 12 receives the present data a and b and the second operational unit 14 receives the previous data C and D. At a time Dt+2, the shift switch SW6 is connected to the first operational unit 12. The first operational unit 12 receives the present data a, b, and c and the second operational unit 14 receives only the previous data D. At a time Dt+3, the shift switches SW5 to SW7 are connected to the first operational unit 12. The output data from the factor multipliers are transmitted to the first operational unit 12.

In this embodiment, the first operational unit 12 receives only the present data and the second operational unit 14 receives only the previous data.

Figure 10:
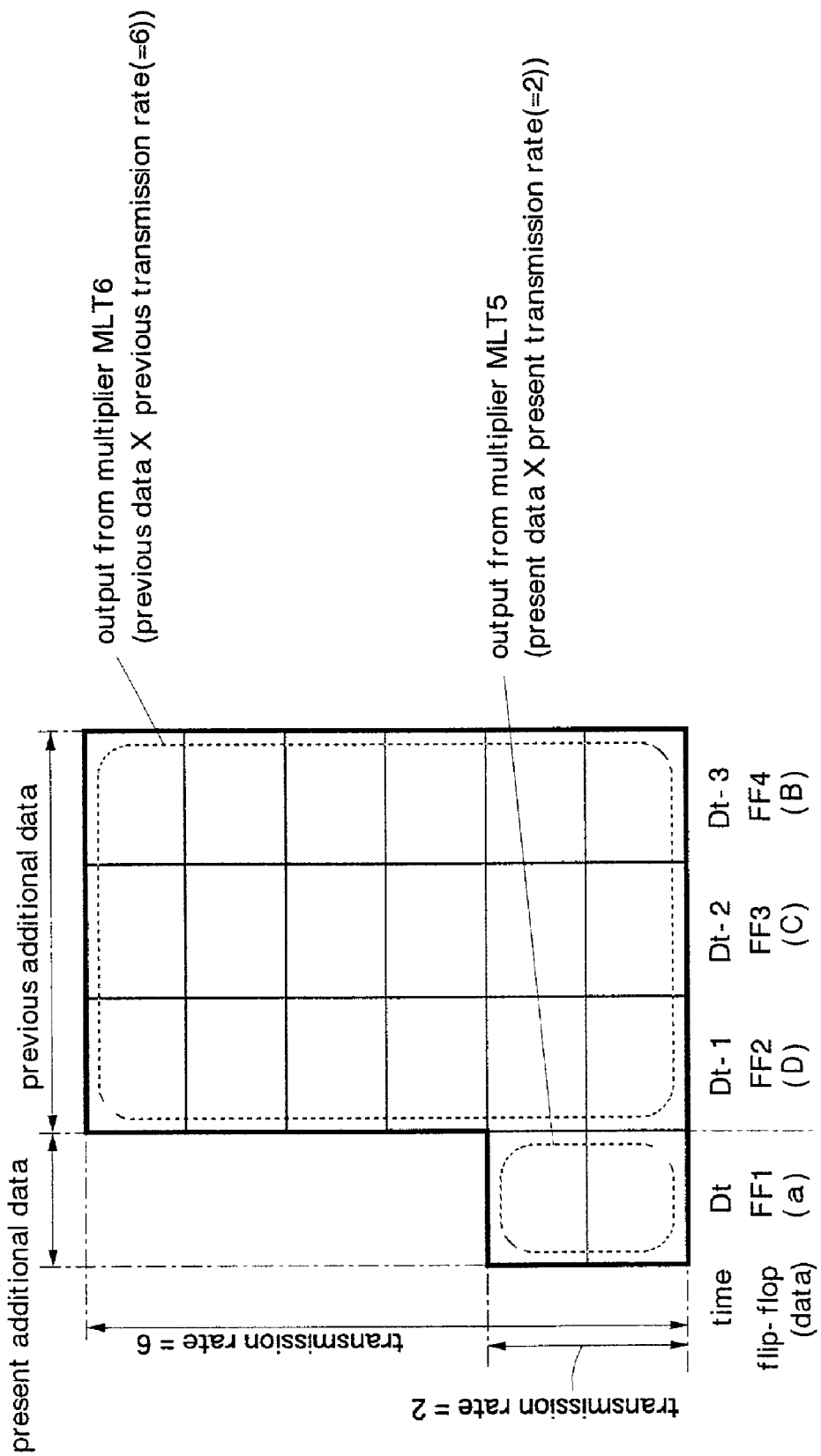
FIG. 10 is an explanatory chart showing an operation of the FIR filter in FIG. 8.

FIG. 10 shows an operation of the FIR filter when the transmission rate is switched (at the time Dt in FIG. 9). The explanation on the same operations as in FIG. 4 described above is omitted.

The second operational unit 14 in FIG. 8 multiplies the previous data D, C, and B by the previous transmission rate "6" in the factor multiplier MLT6. The multiplication result corresponds to the right frame in FIG. 10 depicted with a broken line. The first operational unit 12 in FIG. 8 multiplies the present data "a" by the present transmission rate "2" in the multiplier MLT5. The multiplication result corresponds to the left frame depicted with a broken line in FIG. 10. The adder ADD6 in FIG. 8 then adds the multiplication results to generate output data DOUT which corresponds to a region surrounded by the frame depicted with a bold line in FIG. 10.

In this embodiment, the same effect is also obtained as in the first embodiment 10 described above.

Figure 11:
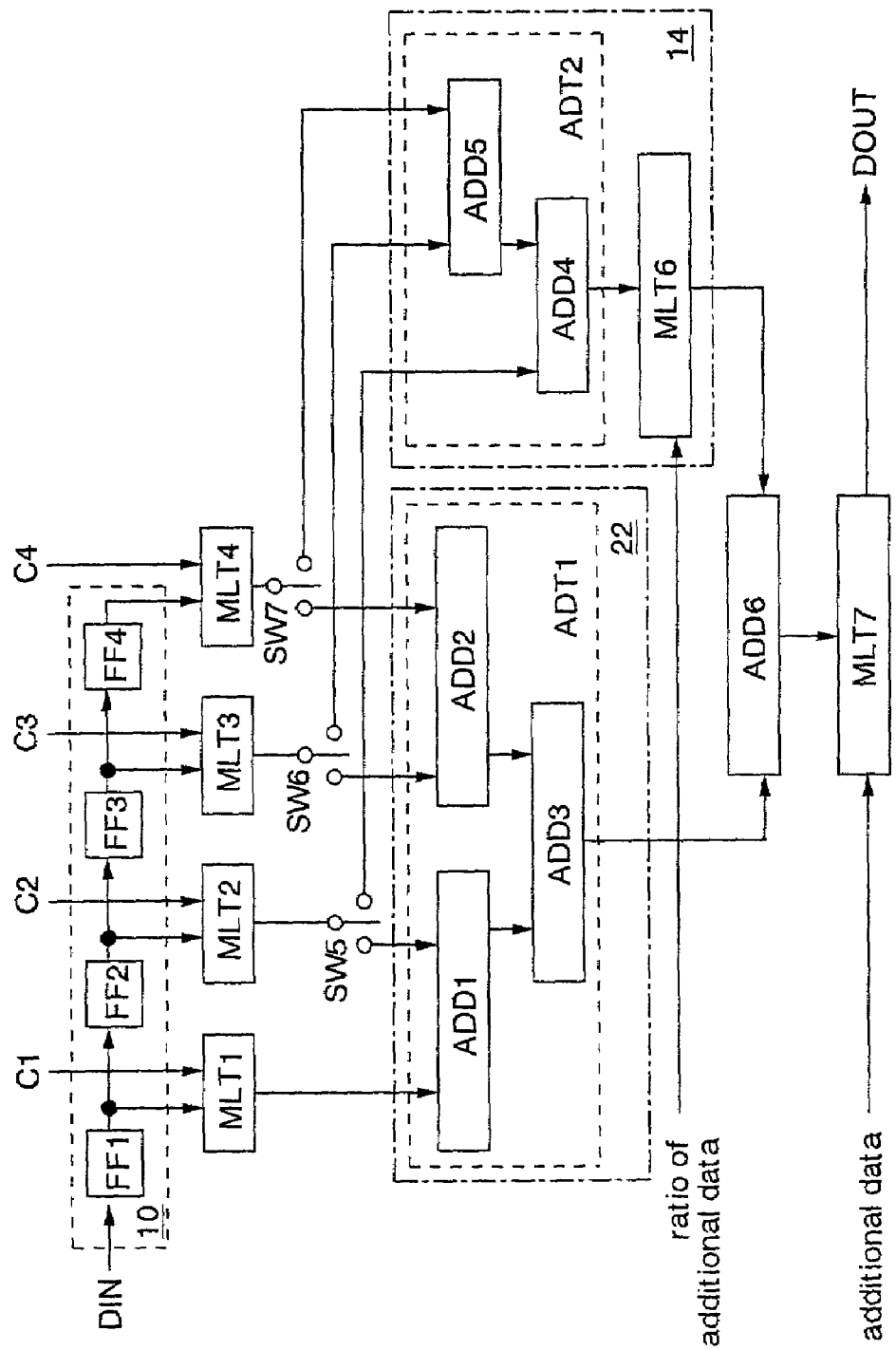
FIG. 11 is a block diagram showing an FIR filter according to a fifth embodiment of the present invention.

FIG. 11 shows an FIR filter according to a fifth embodiment of the present invention.

The same symbols and numerals are added to the same circuits and signals as those described in the first and the fourth embodiments and the detailed explanation thereof is omitted.

As in the first embodiment, the FIR filter is used in a transmission circuit (a semiconductor integrated circuit) of a portable terminal in a communication system of, for example, a CDMA system or a W-CDMA (Wideband-CDMA) system.

In this embodiment, a first operational unit 22 is formed instead of the first operational unit 12 of the FIR filter shown in FIG. 8. In addition, a multiplier MLT7 for receiving an output from the adder ADD6 is newly formed. The multiplier MLT6 of the second operational unit 14 receives a ratio of additional data (a transmission rate) corresponding to previous data to additional data corresponding to present data (a denominator is the present additional data). Other structures are the same as those in the fourth embodiment (FIG. 8).

The first operational unit 22 is composed of the same adder tree ADT1 as that in FIG. 8. The adder ADD6 multiplies data outputted from the adder tree ADT1 by data outputted from the multiplier MLT6 of the second operational unit 14 and outputs the multiplication result to the multiplier MLT7. The multiplier MLT7 multiplies data from the adder ADD6 by the present additional data (transmission rate) and outputs the multiplication result as output data DOUT (an output response).

Figure 12:
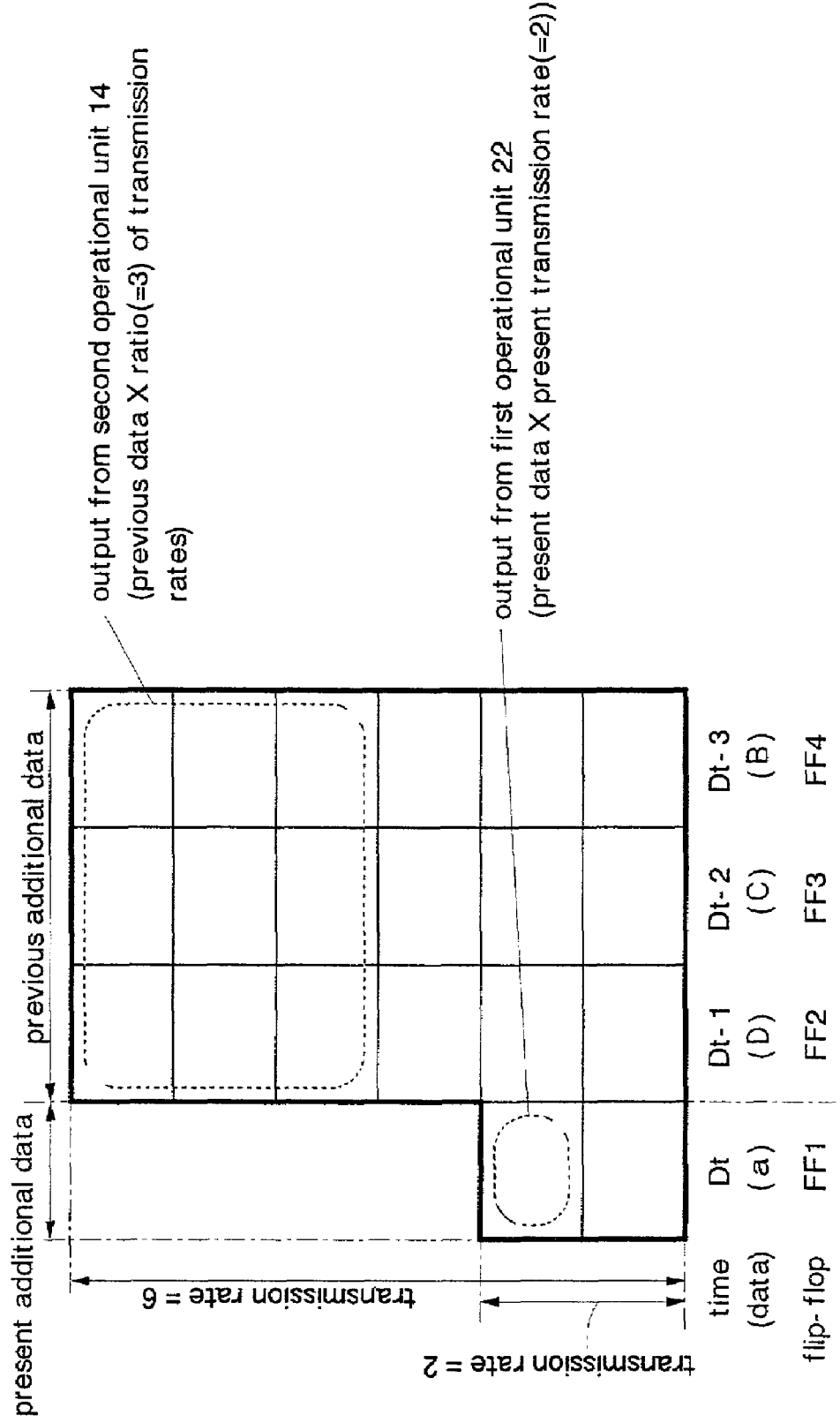
FIG. 12 is an explanatory chart showing an operation of the FIR filter in FIG. 11.

FIG. 12 shows an operation of the FIR filter when a transmission rate is changed. The explanation on the same operations as those in FIG. 4 is omitted. In this example, the ratio of the transmission rates, which equals to (the previous transmission rate "6")/(the present transmission rate "2"), is set at "3".

The multiplier MLT6 of the second operational unit 14 in FIG. 11 multiplies the previous data D, C, and B by a ratio of transmission rates "3". The multiplication result corresponds to the right frame depicted with a broken line in FIG. 12. The multiplier MLT5 of the first operational unit 22 in FIG. 11 receives present data a and outputs the received data to the adder ADD6 (corresponding to the left frame depicted with a broken line in FIG. 12). These data are added in the adder ADD6 and transmitted to the multiplier MLT7. The multiplier MLT7 then multiplies the data from the adder ADD6 by the present transmission rate "2". The multiplication result corresponds to the frame depicted with a bold line in the drawing, which is "twice" as large as the two frames depicted with a broken line.

In this embodiment, the same effect is also obtained as in the first embodiment described above.

Figure 13:
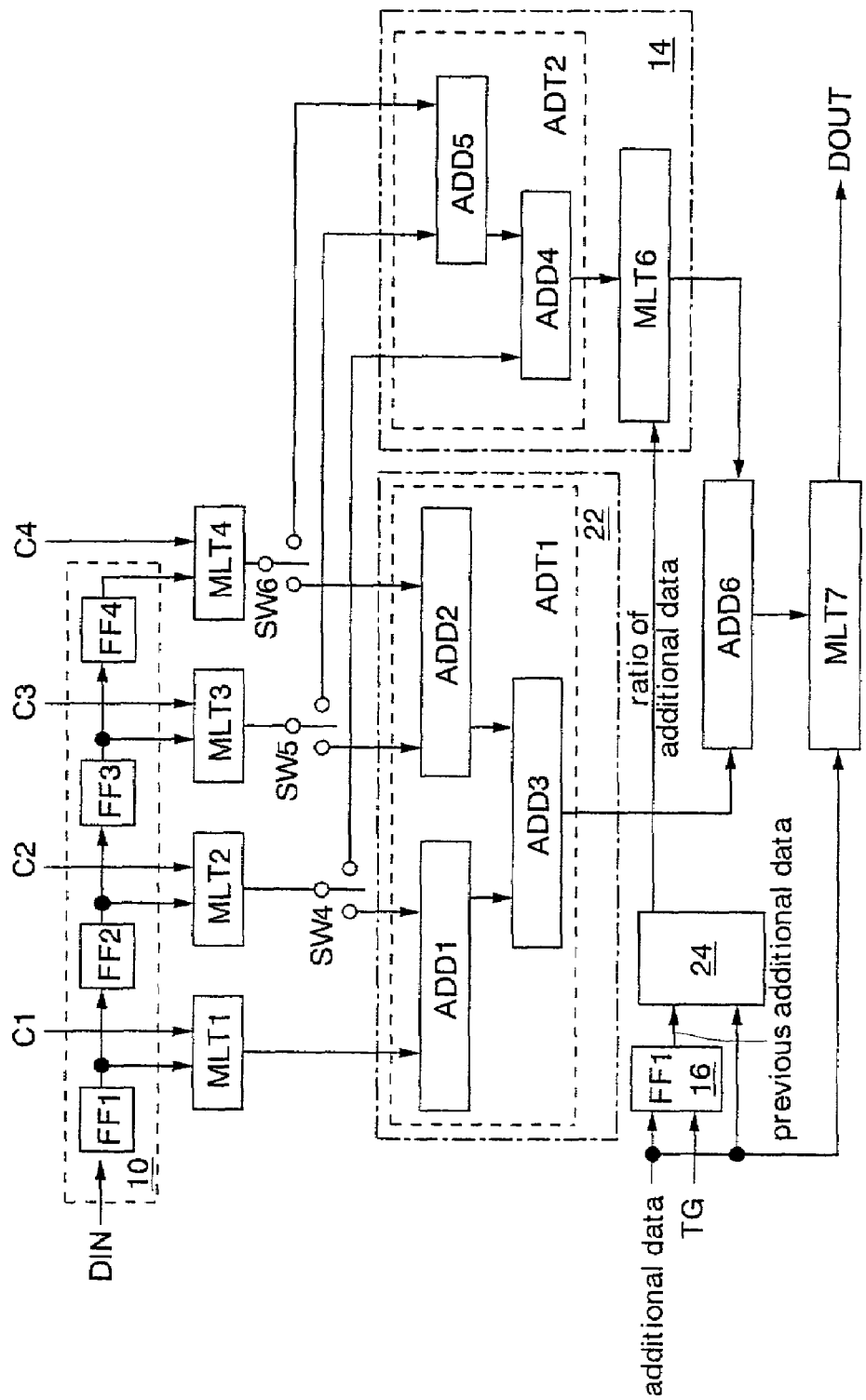
FIG. 13 is a block diagram showing an FIR filter according to a sixth embodiment of the present invention.

FIG. 13 shows an FIR filter according to a sixth embodiment of the present invention. The same symbols and numerals are added to the same circuits and signals as those described in the first embodiment and the detailed explanation thereof is omitted.

As in the first embodiment, the FIR filter is used in a transmission circuit (a semiconductor integrated circuit) of a portable terminal in a communication system of, for example, a CDMA system or a W-CDMA (Wideband-CDMA) system. The FIR filter according to this embodiment is constituted with the holding circuit 16 and an operational circuit 24 additionally provided in the FIR filter 2 in FIG. 11. Other structures are the same as those in the sixth embodiment (FIG. 11).

The holding circuit 16, which is composed of a flip-flop, accepts additional data (a transmission rate) in synchronization with a trigger signal TG which is generated every time input data DIN is supplied. As a result, previous additional data is outputted from the holding circuit 16. The operational circuit 24 obtains a ratio of present additional data to the previous additional data held by the holding circuit 16 and then outputs the obtained ratio to the multiplier MLT6.

An operation of the FIR filter according to this embodiment is the same as that in the first embodiment described above and therefore, the explanation thereof is omitted.

The same effect is also obtained as in the second and the sixth embodiments described above. In this embodiment, the ratio of the additional data can be further obtained by simple logic circuits (the holding circuit 16 and the operational circuit 24). In other words, the operation for obtaining the ratio of the additional data can be easily controlled.

Incidentally, in the above embodiments there have been described examples where the input data DIN consisting of transmitting information and additional data (for example, a transmission rate) which is added in order to transmit the input data DIN are separately received to generate the output data DOUT. However, the present invention is not limited to the above embodiments. For example, data including the input data DIN and the additional data may be received and standardized in a data separation unit provided in the FIR filter, and the standardized data is separated into the input data DIN and the additional data so as to generate output data from the separated data.

Furthermore, the additional data does not have to be a transmission rate. The additional data may be any data as long as it is added to the input data DIN for the purpose of reliably receiving the input data DIN consisting of transmitting information at a transmission side.

The invention is not limited to the above embodiments and various modifications may be made without departing from the spirit and the scope of the invention. Any improvement may be made in part or all of the components.

What is claimed is:

1. A finite impulse response (FIR) filter comprising: a first operational unit for operating input data which including a first input data and a second input data inputted after the first input data, said input data consists of transmitting information and is composed of bit strings, and additional data which is added in order to transmit said input data and; a second operational unit for operating on the first input data and a difference between said additional data corresponding to the first input data and said additional data corresponding to the second input data; and an adding unit for adding results of the first and second operational units and outputting the resultant as a filter response.

2. The FIR filter according to claim 1, further comprising: a data separation unit for separating data inputted to the filter into said input data and said additional data.

3. The FIR filter according to claim 1, further comprising: a shift register for receiving said input data in sequence; and factor multipliers for multiplying outputs from each of delay elements of said shift register by tap factors, and wherein:

said first operational unit includes a first wider tree for adding outputs front said factor multipliers and a first multiplier for multiplying an output from said first adder tree by said additional data;

said second operational unit includes a second adder tree for adding said first input data among said outputs from said factor multipliers and a second multiplier for multiplying an output from said second adder tree by said difference; and said adding unit adds an output from said first multiplier and an output from said second multiplier.

4. The FIR filter according to claim 3, further comprising switches for connecting outputs of said factor multipliers to said second adder tree, wherein
said switches are switched on and off in response to a shift operation of said input data in said shift register and transmit said first input data to said second adder tree.

5. The FIR filter according to claim 4, wherein
said switches are switched off in response w every shift operation of said shift register, the switching-off being performed in sequence, starting from a switch corresponding to one of said factor multipliers at an input side.

6. The FIR filter according to claim 3, further comprising switches for connecting said second adder free to one of an output of a predetermined one of said factor multipliers and an output of a predetermined one of adders which compose said first adder tree, wherein
said switches are switched on and off in response to a shift operation of said input data in said shift register and transmit said first input data to said second adder tree.

7. The FIR filter according to claim 1, further comprising:
a holding circuit for accepting said additional data in response to a change in said input data and holding the accepted data as said additional data corresponding to said first input data; and
an operational circuit for operating a difference between said additional data outputted from said holding circuit and new additional data.

8. A finite impulse response (FIR) filter comprising: a first operational unit for operating on a second input data inputted after a first input data among input data which includes the first input data and the second input data and consists of transmitting information and is composed of bit strings, and additional data which is added in order to transmit the second input data; a second operational unit for operating on the first input data and said additional data corresponding to said first input data; and an adding unit for adding results of the fast and second operational units and outputting the resultant as a filter response.

9. The FIR filter according to claim 8, further comprising
a data separation unit for separating data inputted to the filter into said input data and said additional data.

10. The FIR filter according to claim 8, further comprising:
a shift register for receiving said input data in sequence;
factor multipliers for multiplying outputs from each of delay elements of said shift register by tap factors; and
switches being switched on and off in response to a shift operation of said input data in said shift register, for transmitting outputs from said factor multipliers to one of said first operational unit and said second operational unit.

11. A method of operating a finite impulse response (FIR) filter, comprising the steps of: receiving in sequence input data which includes a first input data and a second input data inputted after the first input data, said input data consists of transmitting information and is composed of bit strings; operating said input data and additional data which is added in order to transmit said input data; operating the first input data and a difference between said additional data corresponding to said first input data and said additional data corresponding to the second input data; and adding results of said operations and outputting the resultant as a filter response.

12. A method of operating a finite impulse response (FIR) filter, comprising the steps of: receiving in sequence input data which includes a first input data and a second input data inputted after the first input data, said input data consists of transmitting information and is composed of bit strings; operating the second input data and additional data which is added in order to transmit said second input data; operating the input data and additional data corresponding to said first input data; and adding results of said operations and outputting the resultant as a filter response.

13. A semiconductor integrated circuit including a finite impulse response (FIR) filter, wherein the FIR filter comprises: a first operational unit for operating input data which includes a first input data and a second input data inputted after the first input data, said input data consists of transmitting information and is composed of bit strings, and additional data which is added in order to transmit said input data; a. second operational unit for operating the first input data and a difference between said additional data corresponding to the first input data and said additional data corresponding to the second input data; and an adding unit for adding results of the first and second operations and outputting the resultant as a filter response.

14. A semiconductor integrated circuit including a finite impulse response (FIR) filter, wherein the FIR filter comprises: a first operational unit for operating a second input data inputted after a first input data among input data which includes the first input data and the second input data, said input data consists of transmitting information and is composed of bit strings, and additional data which is added in order to transmit said second input data; a second operational unit for operating the input data and said additional data corresponding to said first input data; and an adding unit for adding results of the fast and second operations and outputting the resultant as a filter response.

15. A transmission circuit for use in a communication system comprising:
a first operational unit for operating input data which includes a first input data and a second input data inputted after the first input data, said input data consists of transmitting information and is composed of bit strings, and additional data which is added in order to transmit said input data;
a second operational unit for operating the first input data and a difference between said additional data corresponding to the first input data and said additional data corresponding to the second input data; and
an adding unit for adding results of the first and second operations and outputting the resultant as a filter response.

16. A transmission circuit for use in a communication system comprising:
a first operational unit for operating a second data inputted after a first input data among input data which includes the first input data and the second input data, said input data consists of transmitting information and is composed of bit strings, and additional data which is added in order to transmit said second input data;
a second operational unit for operating the first input data among said input data and said additional data corresponding to said first input data; and
an adding unit for adding results of said first and second operations and outputting the resultant as a filter response.

* * * * *